United States Patent [19]

Huang et al.

[11] Patent Number: 5,635,423

[45] Date of Patent: Jun. 3, 1997

[54] SIMPLIFIED DUAL DAMASCENE PROCESS FOR MULTI-LEVEL METALLIZATION AND INTERCONNECTION STRUCTURE

[75] Inventors: Richard J. Huang; Angela Hui, both of Milpitas; Robin Cheung, Cupertino; Mark Chang, Los Altos; Ming-Ren Lin, Cupertino, all of Calif.

[73] Assignee: Advanced Micro Devices, Inc., Sunnyvale, Calif.

[21] Appl. No.: 320,516

[22] Filed: Oct. 11, 1994

[51] Int. Cl.$^6$ .................................................. H01L 21/44
[52] U.S. Cl. .................... 437/195; 437/190; 437/203; 156/652.1; 156/653.1
[58] Field of Search .................................. 437/195, 190, 437/182, 203; 156/DIG. 652.1, DIG. 653.1

[56] References Cited

U.S. PATENT DOCUMENTS

| | | | |
|---|---|---|---|
| 3,844,831 | 10/1974 | Cass et al. | 437/195 |
| 3,961,414 | 6/1976 | Humphreys | 437/195 |
| 4,472,240 | 9/1984 | Kameyama . | |
| 4,536,951 | 8/1985 | Rhodes et al. | 437/195 |
| 4,764,484 | 8/1988 | Mo | 437/195 |
| 4,801,350 | 1/1989 | Mattox et al. . | |
| 4,933,303 | 6/1990 | Mo | 437/190 |
| 4,948,755 | 8/1990 | Mo | 437/195 |
| 4,996,167 | 2/1991 | Chen . | |
| 5,055,423 | 10/1991 | Smith et al. | 437/195 |
| 5,093,279 | 3/1992 | Andreshak et al. . | |
| 5,262,354 | 11/1993 | Cote et al. . | |
| 5,354,711 | 10/1994 | Heitzmann et al. | 437/182 |
| 5,470,788 | 11/1995 | Biery et al. | 437/190 |

FOREIGN PATENT DOCUMENTS

| | | |
|---|---|---|
| 0 224 013 | 6/1987 | European Pat. Off. . |
| 0 425 787 | 5/1991 | European Pat. Off. . |
| 0 435 187 | 7/1991 | European Pat. Off. . |
| 0 463 972 | 1/1992 | European Pat. Off. . |

OTHER PUBLICATIONS

Kikuta et al., "Al–Gr Reflow Sputtering For Submicron-–Contact-Hole Filling", Microelectronics Research Laboratories, NEC Corporation, IEEE VMIC Conference, Jun. 11–12, 1991, pp. 5.2.1–5.2.4.

IBM Technical Disclosure Bulletin, vol. 30, No. 8, Jan 1988, New York, US, pp. 252–253, XP 000097503 Anonymous "Methods of forming small contact holes".

Proceedings of the 8th International IEEE VLSI Multilevel Interconnection Conference, Santa Clara, CA, USA, Jun. 11–12, 1991, pp. 144–152, Kaanta et al., "Dual damascene: a ULSI wiring technology".

Joshi, "A New Damascene Structure for Submicrometer Interconnect Wiring," IEEE Electron Letters, vol. 14, No. 3, Mar. 1993, pp. 129–132.

Kaanta et al., "Dual Damascene: A ULSI Wiring Technology," Jun. 11–12, 1991, VMIC Conference, IEEE, pp. 144–152.

Kenny et al., "A Buried–Plate Trench Cell for a 64–Mb DRAM," 1992 Symposium on VLSI Technology Digest of Technical Papers, IEEE, pp. 14 and 15.

*Primary Examiner*—Charles L. Bowers, Jr.
*Assistant Examiner*—Lynne A. Gurley

[57] ABSTRACT

A semiconductor device containing an interconnection structure having a reduced interwiring spacing is produced by a modified dual damascene process. In one embodiment, an opening for a via is initially formed in a second insulative layer above a first insulative layer with an etch stop layer therebetween. A larger opening for a trench is then formed in the second insulative layer while simultaneously extending the via opening through the etch stop layer and first insulative layer. The trench and via are then simultaneously filled with conductive material.

13 Claims, 8 Drawing Sheets

5,635,423

SIMPLIFIED DUAL DAMASCENE PROCESS FOR MULTI-LEVEL METALLIZATION AND INTERCONNECTION STRUCTURE

TECHNICAL FIELD

The present invention relates to a semiconductor device containing an interconnection structure comprising conductive wiring and conductive vias on a substrate, and to a dual damascene process for forming an interconnection structure. The invention has particular application in submicron circuit manufacturing.

BACKGROUND ART

The escalating requirements for density and performance associated with ultra large scale integration semiconductor wiring require responsive changes in interconnection technology which is considered one of the most demanding aspects of ultra large scale integration technology. High density demands for ultra large scale integration semiconductor wiring require planarized layers with minimal spacing between conductive wiring lines.

A traditional method for forming interconnection structures comprises the use of a subtractive etching or etch back step as the primary metal-patterning technique. One such traditional technique is illustrated in part in FIGS. 1(a)–1(b), wherein insulative layer 12, such as an oxide layer, is formed on semiconductor substrate 11, such as monocrystalline silicon, with conductive contacts/vias 13 formed in insulative layer 12. A metal layer 14, such as aluminum or tungsten, is deposited on insulating layer 12 and a photoresist pattern 15 formed on metal layer 14 corresponding to the wiring pattern. After etching, a dielectric layer 16 is applied to the resulting wiring pattern 14. The interconnection structure comprises conductive contacts/vias 13 and conductive wiring 14.

In employing such a traditional method, it is extremely difficult to form a planarized layer after filling in the spaces between the conductive wiring 14, as by chemical-mechanical polishing (CMP) planarization techniques. In addition, such a traditional technique often results in the formation of voids 17 as seen in FIG. 1(b) in the spacing between interconnection wirings 14. Additional difficulties include trapping of impurities or volatile materials in the interwiring spaces which may damage the device. Moreover, the traditional etch back approach leads to defects which, even if cosmetic, impose a competitive disadvantage in the commercial environment.

Additional disadvantages of traditional etch back methods include poor metal step coverage, residual metal shorts leading to inconsistent manufacturability, low yields, uncertain reliability and poor ultra large scale integration extendability. Significantly, traditional etch back methods were unable to yield sufficiently planarized layers having interwiring spaces of less than 3.5 microns.

A prior attempt to address the disadvantages attendant upon traditional etch back methods for providing interconnection structures comprises a single damascene wiring technique. Damascene, an art which has been employed for centuries for the fabrication of jewelry, has recently been adapted for application in the semiconductor industry. Damascene basically involves the formation of a trench which is filled in with a metal. Thus, damascene differs from the traditional etch back methods of providing an interconnection structure by providing a trench which is filled in with metal followed by planarization; whereas, the traditional etch back technique involves building up a metal wiring layer and filling in the interwiring spaces with a dielectric material.

A prior art single damascene technique is illustrated in FIGS. 2(a)–2(e) wherein insulative layer 22 is deposited on semiconductor substrate 21. A photoresist pattern 23 is formed on insulative layer 22 and openings formed in insulative layer 22 by reactive ion etching (RIE). Subsequently, a metal 24, such as tungsten, is deposited within the openings and on insulative layer 22, as by chemical vapor deposition as shown in FIG. 2(d). Alternatively, hot aluminum 25 can be formed in the openings and on insulative layer 22 as shown in FIG. 2(e). Thus, the prior art single damascene technique results in a single conductive opening, e.g., a conductive via. Upon planarization and repetition of the foregoing steps, as by depositing a second insulative layer 33, metal 35 and planarization, an interconnection structure is obtained as shown in FIG. 3. The first layer comprises conductive vias 34 through first insulative layer 32 on semiconductor substrate 31. The conductive wiring 35 in second insulative layer 33 electrically connected to conductive vias 34 at 36.

The single damascene technique offers the advantage of improved planarization; however, it is time consuming in requiring numerous processing steps. Undesirably, an interface exists between the conductive via and conductive wiring. Moreover, adequate planarized layers containing an interwiring spacing less than 0.35 µ cannot be obtained.

An improvement in the single damascene process, called dual damascene, has recently been developed by IBM. See, for example, Joshi, "A New Damascene Structure for Submicrometer Interconnect Wiring," IEEE Electron Letters, vol. 14, No. 3, March 1993, pages 129–132; and Kaanta et al., "Dual Damascene: A ULSI Wiring Technology," Jun. 11–12, 1991, VMIC Conference, IEEE, pages 144–152. The use of a damascene technique wherein the dielectric is planarized by chemical-mechanical polish is discussed in Kenny et al., "A Buried-Plate Trench Cell for a 64-Mb DRAM," 1992 Symposium on VLSI Technology Digest of Technical Papers, IEEE, pages 14 and 15.

U.S. Pat. No. 5,262,354 discloses a three-step method of forming electrically conductive vias and lines involving a damascene technique to create lines on a substrate. In addition, this patent discloses the advantages of chemical-mechanical polishing with an aluminum slurry in dilute nitric acid to planarize a dielectric surface. U.S. Pat. No. 5,093,279 discloses a laser ablation damascene process for planarizing metal/polymer structures in the fabrication of both interlevel via metallization and circuitization layers in integrated circuit interconnects.

The dual damascene technique involves the simultaneous formation of a conductive via and conductive wiring, thereby requiring fewer manipulative steps than the single damascene technique and eliminating the interface between the conductive via and conductive wiring which is necessarily formed by the single damascene technique. The dual damascene technique is illustrated in FIGS. 4(a)–4(c), wherein insulative layer 42 is deposited on semiconductor substrate 41 and then patterned by conventional photolithographic techniques to form a first opening 43 which is about the size of the ultimate via. Subsequently, as shown in FIG. 4(b), photoresist layer 44 is deposited and patterned to form a second opening 45 about the size of the ultimate trench. Anisotropic reactive ion etching (RIE) is then conducted which, in effect, duplicates the first and second openings in insulative layer 42, thereby forming a via and trench. Subsequently, a conductive material such as aluminum, tungsten, copper or alloys thereof, with or without an adhesion/barrier layer, e.g., titanium nitride or a titanium-tungsten alloy, under the conductive material, is provided to form conductive via 46 and conductive wiring 47 as shown in FIG. 4(c). This process is repeated to form a plurality of layers such as second conductive via 48 and second conductive interconnect wiring 49 also shown in FIG. 4(c). The resulting structure is characterized by an interface between the separately formed conductive patterns, i.e., between the first conductive wiring and second conductive via; however, no interface is formed between the conductive via and conductive wiring of each separately formed pattern.

Although the dual damascene technique offers advantages vis-à-vis the traditional etch back technique and the single damascene technique, we have found that it also suffers from several disadvantages. We have found that it is extremely difficult to control the profile of the vias and trenches employing the dual damascene technique and, hence, difficult to control the depth and resistivity of the conductive wiring. Moreover, satisfactory planarized layers having an interwiring spacing of less than 0.35 micron cannot be attained with the above-described dual damascene technique.

DISCLOSURE OF THE INVENTION

An object of the present invention is a highly integrated semiconductor device containing an interconnection structure of planarized layers having minimal interwiring spacing.

Another object is an improved dual damascene method for forming an interconnection structure having improved control of the profile of conductive vias and conductive wiring.

A further object of the invention is an improved dual damascene process having a reduced number of manipulative steps.

Additional objects, advantages and other features of the invention will be set forth in part in the description which follows and in part will become apparent to those having ordinary skill in the art upon examination of the following or may be learned from practice of the invention. The objects and advantages of the invention may be realized and obtained as particularly pointed out in the appended claims.

According to the present invention, the foregoing and other objects are achieved in part by a highly integrated semiconductor device having an interconnection structure comprising a plurality of planarized layers with conductive wiring, wherein the distance between conductive wires or interwiring spacing is less than about 0.35 μ.

A further aspect of the invention is a method of forming a conductive wiring and conductive via on a substrate, which method comprises forming a first insulative layer on the substrate and an etch stop layer on the first insulative layer. A second insulative layer is formed on the etch stop layer and a first opening of about the size of the ultimate via is formed in the second insulative layer. Using a mask, a trench is formed in the second insulative layer while simultaneously forming a via in the etch stop and in the first insulative layer. Subsequently, a conductive material is simultaneously deposited in and completely fills the via and trench, with the conductive via providing electrical connection between the conductive wiring and substrate.

Another aspect of the invention is a method of forming a conductive wiring and a conductive via on a substrate, which method comprises forming a first insulative layer on a substrate and forming an etch stop layer on the first insulative layer. A second insulative layer is formed in the etch stop layer and a trench formed in the second insulative layer at a first location where the wiring is desired. A first opening is then formed in the etch stop layer and in the first insulative layer at a second location where the via is desired, with the first opening penetrating through the etch stop layer and the first insulative layer. Subsequently, a conductive material is simultaneously deposited in the first opening and in the trench completely filling the first opening and the trench, the trench forming the conductive wiring, the first opening forming the conductive via, the conductive via providing electrical connection between the conductive wiring and the substrate.

Another aspect of the invention is a method of forming a conductive wiring and conductive via on a substrate, which method comprises forming an insulating layer on the substrate and forming a trench in the insulative layer at a first location where the wiring is desired. An etch stop layer is then formed in the insulative layer and a first opening formed inside the trench in the etch stop layer at a second location where the via is desired, but not in the insulative layer. A second opening of about the size of the first opening is formed under the first opening in the insulative layer at the second location where the via is desired using the etch stop layer as a hard mask. The etch stop layer is then removed and a conductive material is simultaneously deposited in the openings and in the trench so that the conductive material completely fills the openings and the trench, the trench forming the conductive wiring, the openings forming the conductive via, and the conductive via providing electrical connection between the conductive wiring and the substrate.

Still another object of the invention is a method of forming a conductive wiring and a conductive via on a substrate, which method comprises forming a first insulative layer on the substrate and forming an etch stop layer on the first insulative layer. A first opening is formed in the etch stop layer at a first location where the via is desired, the first opening penetrating through the etch stop layer. A second insulative layer is formed on the etch stop layer. Subsequently, a trench is formed in the second insulative layer at a second location where the wiring is desired and, simultaneously, a second opening is formed through the first opening and the first insulative layer. The trench and the second opening penetrates through the second insulative layer and the first insulative layer, respectively. A conductive material is then simultaneously deposited in the second opening and in the trench so that the conductive material completely fills the second opening and the trench, the trench forming the conductive wiring, the second opening forming the conductive via and the conductive via providing electrical connection between the conductive wiring and the substrate.

DESCRIPTION OF THE INVENTION

Figure 1A:
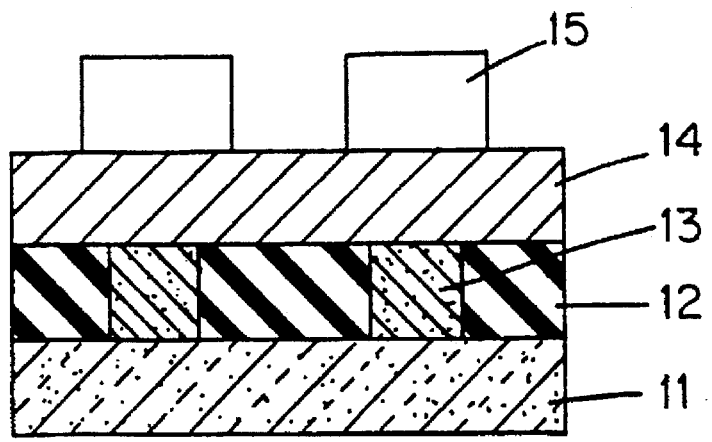
FIGS. 1(a) and 1(b) are sequential cross-sectional views of a prior art semiconductor substrate showing formation of a conductive via and conductive wiring.
Figure 1B:
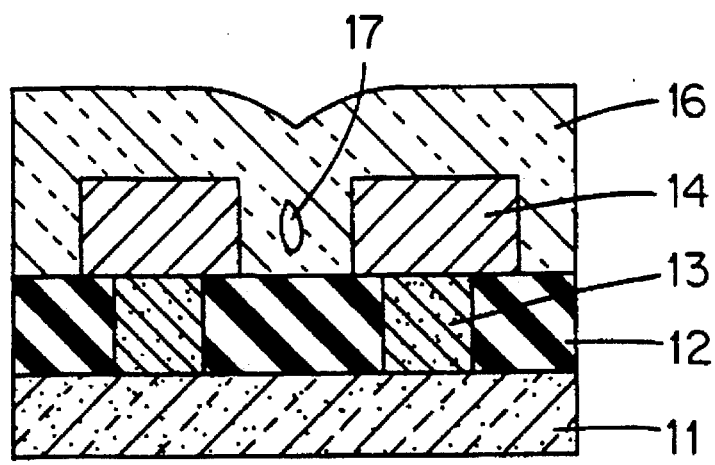
Figure 2A:
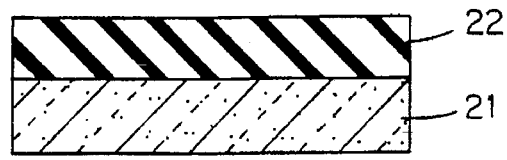
FIGS. 2(a) through 2(e) depict sequential cross-sectional views of a prior art structure formed by a single damascene technique.
Figure 2B:
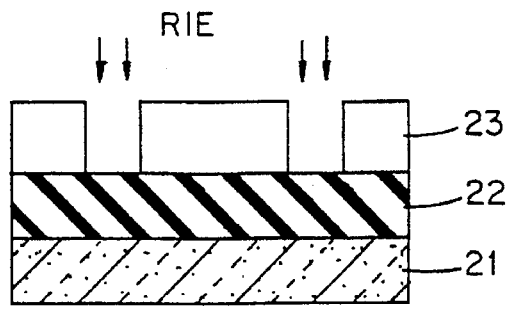
Figure 2C:
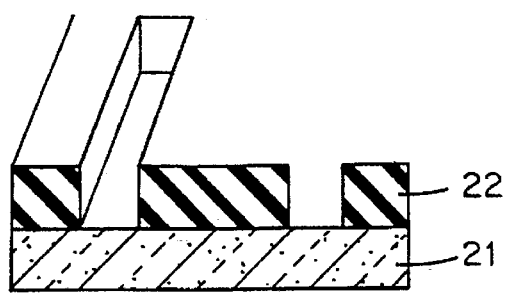
Figure 2D:
Figure 2E:
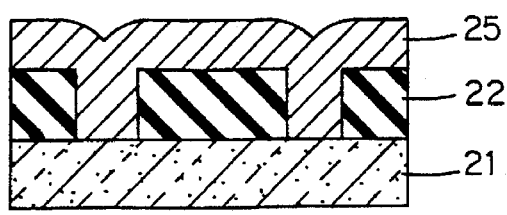
Figure 3:
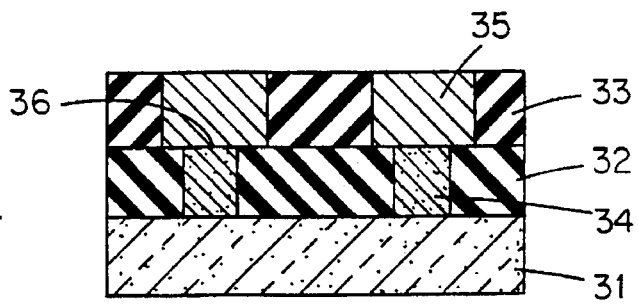
FIG. 3 depicts a prior art semiconductor substrate produced by repetition of a single damascene technique.
Figure 4A:
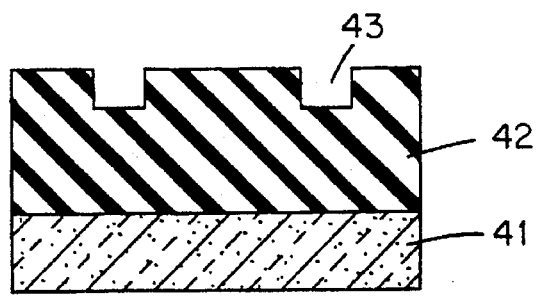
FIGS. 4(a) through 4(c) depict sequential cross-sectional views of a prior art structure formed by a dual damascene technique.
Figure 4B:
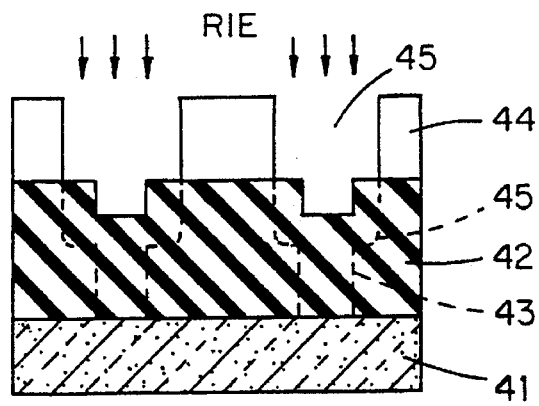
Figure 4C:
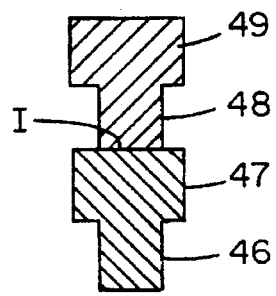

The present invention is directed to a semiconductor device comprising a substrate and a plurality of planarized layers vertically formed thereon, and an interconnection structure comprising conductive vias and conductive wiring, wherein the profiles of the conductive vias and conductive wiring are controlled with great accuracy to achieve minimal interwiring spacing as required by high density design rule. Preferably, the interwiring spacing is less than about 0.35 μ. It is particularly preferred to provide an interwiring spacing of from about 0.05 μ to about 0.18 μ, most preferably from about 0.05 μ to about 0.10 μ. A semiconductor device having such improved conductive via and conductive wiring profiles and minimal interwiring spacing is achieved by a process comprising a sequence of manipulative steps which include a dual damascene technique wherein vias and trenches are simultaneously filled with a conductive material.

The various embodiments of the present invention comprises a dual damascene technique wherein the vias and trenches are simultaneously filled with conductive material conventionally employed in fabricating interconnection structures, such as aluminum, tungsten copper and alloys, with or without an adhesion/barrier layer. The conductive material is simultaneously deposited in the vias and trenches by techniques which are known in the art. For example, metallization techniques such as various types of chemical vapor deposition (CVD) processes, including low pressure chemical vapor deposition (LPCVD), and plasma enhanced chemical vapor deposition (PECVD) may be employed. Normally, when high melting point metals such as tungsten are deposited, CVD techniques are used. Low melting point metals, such as aluminum and aluminum-based alloys including aluminum-copper alloys, may be deposited by melting or sputtering. Polysilicon can also be employed as a conductive material in the interconnection pattern.

The various embodiments of the present invention involve the use of known planarization techniques, such as conventional chemical-mechanical planarization techniques. See, for example, U.S. Pat. Nos. 5,262,354 and 4,944,836, which are incorporated by reference herein in their entirety.

The various embodiments of the present invention involve the formation of openings, such as vias and trenches, employing conventional photolithographic techniques including the use of photoresists, masks, etch recipes, and etching techniques as, for example, plasma etching and reactive ion etching. The various embodiments of the present invention also employ an etch stop layer, such as a nitride layer, preferably silicon nitride ($Si_3N_4$). Etch stop layers are conventionally employed in the art of semiconductor manufacturing, as are their methods of deposition, e.g., CVD, or plating.

The various embodiments of the present invention involve a conventional semiconductor substrate, such as monocrystalline silicon, and conventional insulative layers, such as oxide layers, e.g., layers of a silicon oxide, formed in a conventional manner, as by thermal oxidation of a deposited silicon layer, plasma enhanced CVD, thermal enhanced CVD and spin on techniques.

Figure 5A:
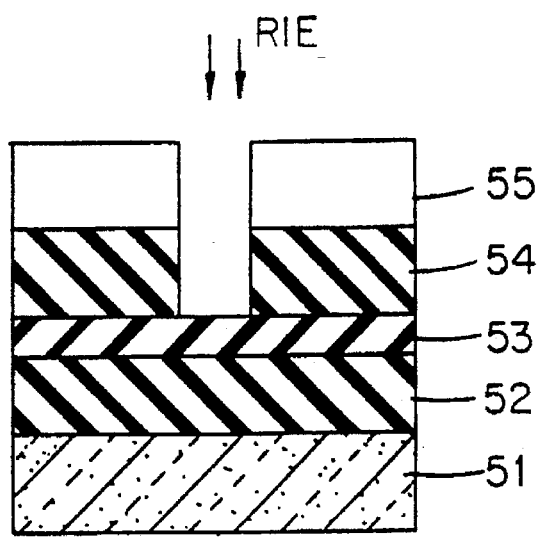
FIGS. 5(a) through 5(c) are sequential cross-sectional views of a semiconductor device having a conductive via and conductive wiring formed in accordance with one embodiment of the present invention.
Figure 5B:
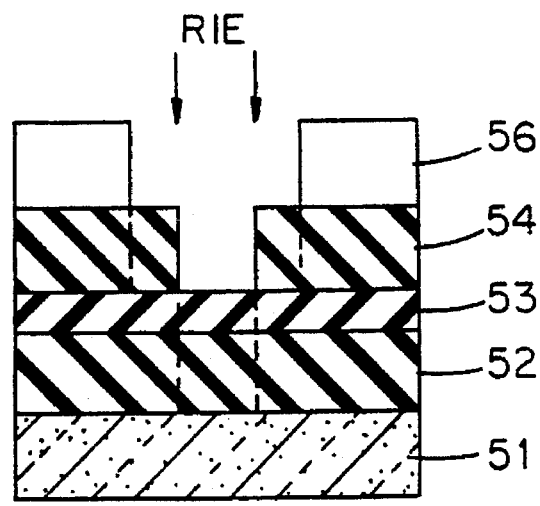
Figure 5C:
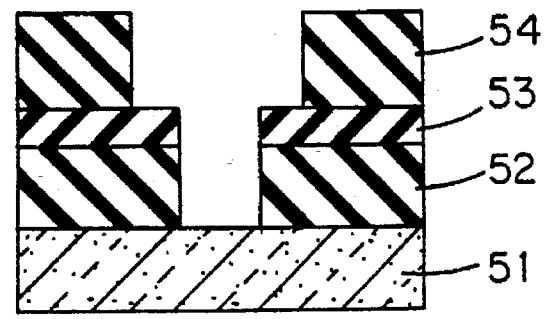

A first embodiment of the present invention is sequentially schematically depicted in FIGS. 5(a) through 5(c), wherein a first insulative layer 52 is deposited on a semiconductor substrate 51, and an etch stop layer 53 deposited on the first insulative layer 52. The etch stop layer can be any suitable conventional stop material selected consistent with the insulative layers. For example, if the insulative layers are made of silicon oxide, the etch stop layer can be made of silicon nitride, silicon oxynitride or undoped polysilicon. A second insulative layer 54 is deposited on the etch stop layer 53 and a first photoresist mask 55 formed on the second insulative layer. A first opening is formed in second insulative layer 54 but not penetrating etch stop layer 53 by a first etching process as shown in FIG. 5(a), preferably anisotropic etching, most preferably reactive ion etching. The size of the first opening is about the size of the ultimate via. As shown in FIG. 5(b), after removing the first photoresist mask 55, a second photoresist mask 56 is formed on second insulative layer 54, a trench is formed in second insulative layer 54 to include the first opening by a second etching process while extending the first opening as shown in phantom lines. As shown in FIG. 5(c), the trench is formed in second insulative layer 54 while simultaneously extending the first opening through etch stop layer 53 and first insulative layer 52. The dual damascene metallization technique is then employed to simultaneously fill the via and trench with conductive material to form an interconnection wherein the conductive via provides electrical connection between the conductive wiring and substrate.

In the first embodiment, the first etching process has a greater selectivity with respect to the etch stop layer than the second etching process. As known in the art, by a greater selectivity with respect to the etch stop layer is meant that the insulative layer is etched at a greater rate than the etch stop layer. After simultaneously filling the via and trench with a conductive material, the second insulative layer 54 is planarized, preferably by chemical-mechanical polishing. This first embodiment provides improved control over the profiles of the via and trench by providing better control of their depth.

Figure 6A:
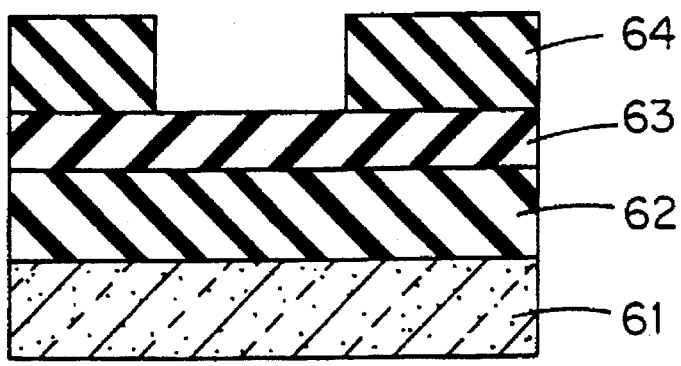
FIGS. 6(a) through 6(c) are sequential cross-sectional views of a semiconductor device having a conductive via and conductive wiring formed in accordance with another aspect of the present invention.
Figure 6B:
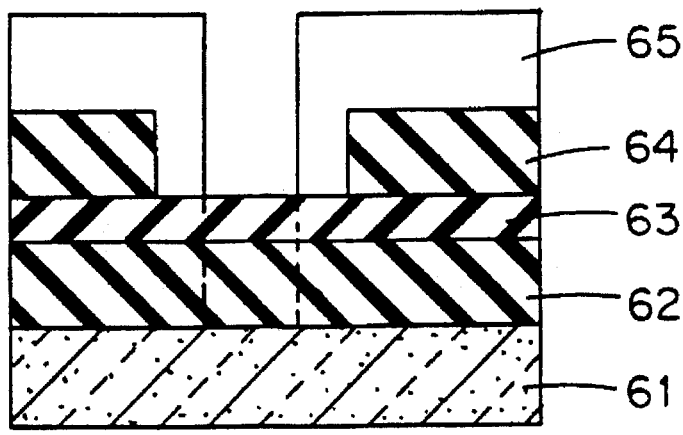
Figure 6C:
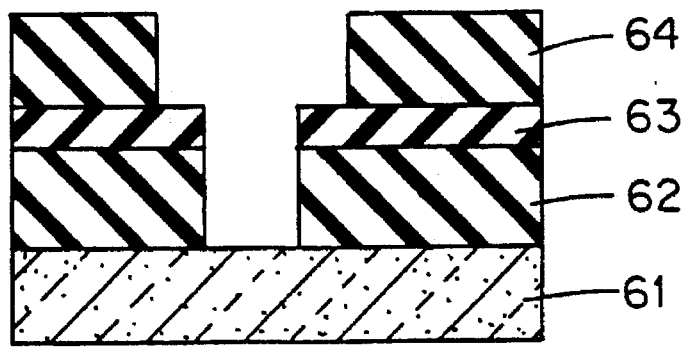

A second embodiment of the present invention is illustrated in FIGS. 6(a) through 6(c) wherein first insulative layer 62 is deposited on semiconductor substrate 61, and an etch stop layer 63, preferably $Si_3N_4$, deposited on first insulative layer 62. A second insulative layer 64 is deposited on etch stop layer 63 and a trench formed in second insulative layer 64 at a first location where the wiring is desired. As shown in FIGS. 6(b) (in phantom) and 6(c), a first opening is formed in etch stop layer 63 and in first insulative layer 62 at a second location where the via is desired, the first opening penetrating through etch stop layer 63 and first insulative layer 62. Subsequently, a conductive material is simultaneously deposited in and completely fills the first opening and the trench, the trench forming the conductive wiring and the first opening forming the conductive via, with the conductive via providing electrical connection between the conductive wiring and the substrate.

Adverting to FIGS. 6(a) through 6(c), it is preferred that the first and second insulative layers 62 and 64, respectively, are oxide layers or insulating materials which have a low dielectric constant. The etch stop layer 63 can be any suitable conventional stop material selected consistent with the insulative layers. For example, if the insulative layers are made of silicon oxide, the etch stop layer can be made of silicon nitride, silicon oxynitride or undoped polysilicon.

The trench in the second insulative layer 64 can be formed by conventional techniques, as by forming a first patterned mask having an opening over second insulative layer 64 in registry with the first location followed by a first etching through second insulative layer 64 stopping at etch stop layer 63. The trench can be formed by any of various etching techniques, preferably plasma etching or reactive ion etching. The first mask is then removed.

The first opening in the etch stop layer and in the first insulative layer can also be formed by conventional techniques as, for example, by forming a patterned photoresist layer 65 as shown in FIG. 6(b) which fills the trench in the second insulative layer 64, and etching a via shown by phantom lines. The via is formed by a second etching through etch stop layer 63 and through first insulative layer 62, and removing the photoresist layer 65. The thus formed via and trench are shown in FIG. 6(b).

The second etching can also be plasma etching or reactive ion etching. The first etching technique preferably has a higher selectivity with respect to the etch stop layer than the second etching technique. Subsequent to simultaneously filling the via and trench with conductive material, the second insulative layer is planarized in a conventional manner, as by chemical-mechanical processing. The conductive material employed can be any conductive material conventionally employed in the semiconductor art for providing interconnection patterns, for example, aluminum, aluminum-based alloys and tungsten.

The second embodiment involves a sequence of steps different from those of the first embodiment, primarily differing by first creating a trench in the second insulative layer and subsequently forming the via; whereas, in the first embodiment, the initially formed opening is about the size of the via and a trench is subsequently formed. The second embodiment offers the advantages of avoiding the occurrence of residual photoresist material at the bottom of the via and better control of the etching steps.

Figure 7A:
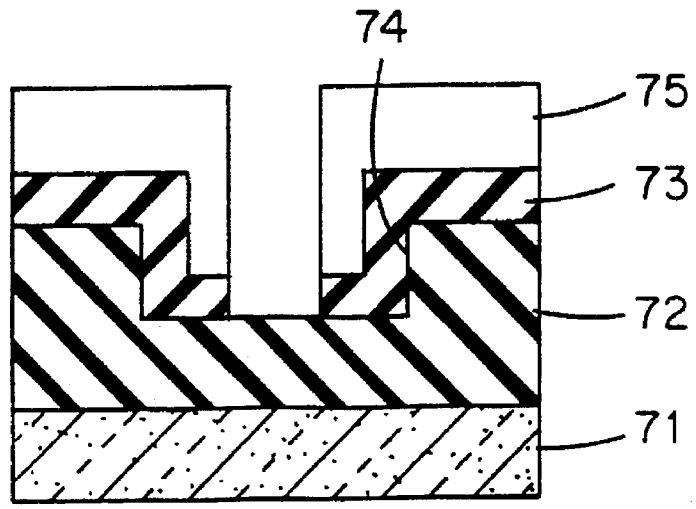
FIGS. 7(a) and 7(b) are sequential cross-sectional views of a semiconductor device having a conductive via and conductive wiring formed in accordance with another embodiment of the present invention.
Figure 7B:
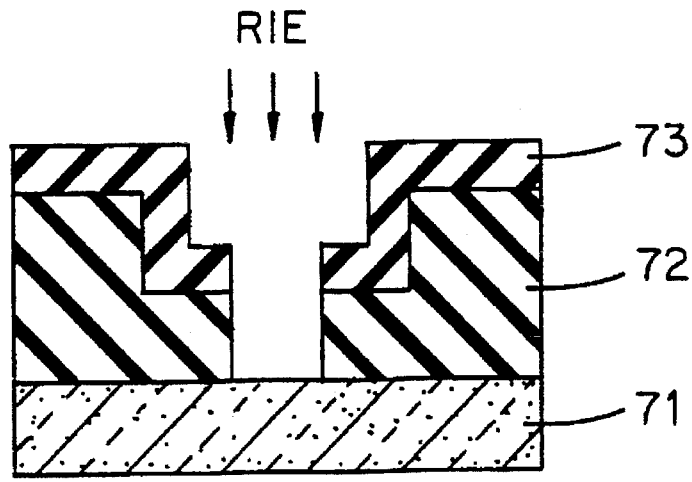
Figure 8A:
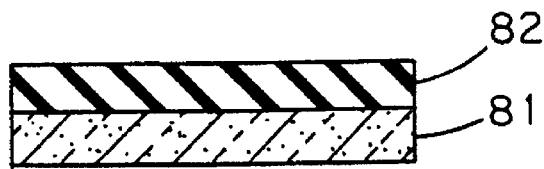
FIGS. 8(a) through 8(g) are sequential cross-sectional views of a semiconductor device having a conductive via and conductive wiring formed in accordance with another embodiment of the present invention.
Figure 8B:
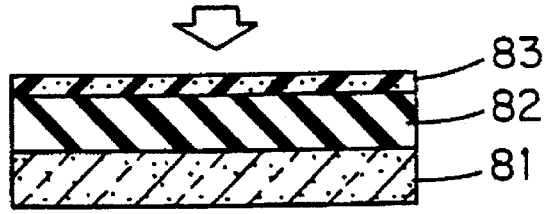
Figure 8C:
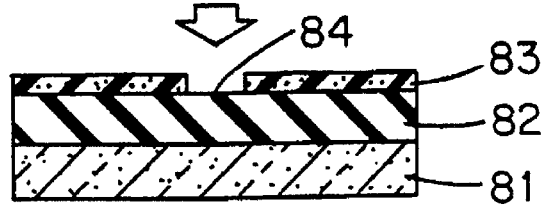
Figure 8D:
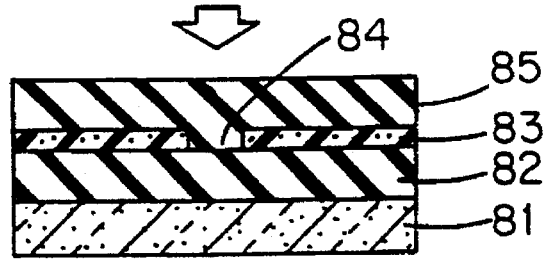
Figure 8E:
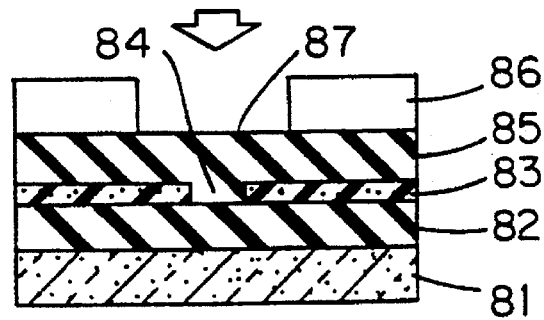
Figure 8F:
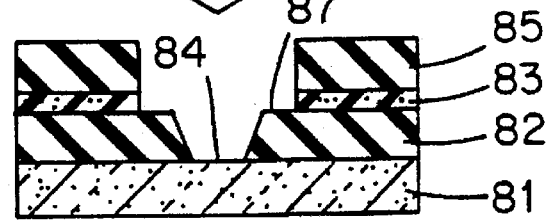
Figure 8G:
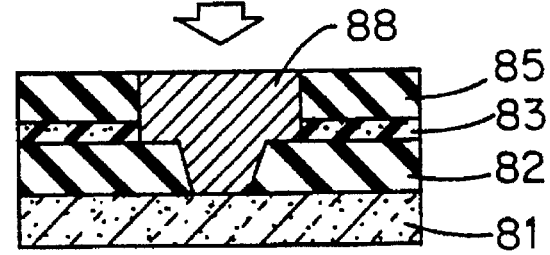

The third embodiment of the present invention avoids the necessity of etching to the depth required in the second embodiment. As shown in FIGS. 7(a) and 7(b), the third embodiment comprises forming insulative layer 72 on semiconductor substrate 71. Subsequently, a trench 74 is formed in insulative layer 72 at first location where the wiring is desired employing conventional photolithograph techniques. An etch stop layer 73 is then formed on insulative layer 72 including the trench. Using photoresist mask 75, an opening is formed inside the trench penetrating through etch stop layer 73 stopping at insulative layer 72 at a second location where the via is desired. A second etching is then conducted using the etch stop layer as a hard mask to extend said opening completely through insulative layer 72. The etch stop layer 73 is removed and a conductive material is simultaneously deposited in the opening and in the trench so that the conductive material completely fills the opening and the trench, the trench forming the conductive wiring and the opening forming the conductive via, with the conductive via providing electrical contact connection between the conductive wiring and the substrate.

The trench is formed by a conventional photolithographic technique, as by forming a first patterned mask having a first mask opening over insulative layer 72 in registry with the first location, etching exposed portions of insulative layer 72 through the first mask opening by first etching process to form the trench and removing the first patterned mask layer.

The opening in etch stop layer 73 and insulative layer 72 can also be formed by conventional photolithographic techniques, as, for example, by forming a second mask pattern over etch stop layer 73 inside the trench with the second mask opening in registry with the second location and etching exposed portions of etch stop layer 73 by a second etching process. The thus patterned etch stop layer 73 then serves as a hard mask for etching through insulative layer 72 using a third etching process.

The second and third etching process for penetrating etch stop layer 73 and insulative layer 72, respectively, can be conventional anisotropic techniques, such as plasma etching or reactive ion etching. The etch stop material can be any conventional etch stop material capable of serving as a hard mask, i.e., non-photoresist material, e.g., titanium nitride.

Subsequent to deposition of the conductive material to simultaneously fill the via and trench, the insulative layer is planarized as by chemical-mechanical polishing. As in the other embodiments, the conductive material employed can be any conductive material conventionally employed in the semiconductor art to produce interconnection structures, such as aluminum, aluminum-based alloys, including aluminum-copper alloys, and tungsten.

In the third embodiment, etching is simplified and can be conducted with greater control since the etch stop material is etched separately from the insulative material. Thus, the third embodiment advantageously avoids the accurate depth of focus requirement of the second embodiment attendant upon etching large depths.

A fourth and most preferred embodiment of the present invention, which is depicted in FIGS. 8(a) through 8(g), is characterized by the advantageous simultaneously etching, in a single step, of the via and trench thereby minimizing the number of manipulative steps and etch recipes. As shown in FIGS. 8(a) through 8(g), a first insulative layer 82 is formed on semiconductor substrate 81 and an etch stop layer 83 formed on first insulative layer 82. A first opening 84 is then formed in etch stop layer 83 at a first location where the via is desired, the first opening 84 penetrating through etch stop layer 84 and stopping at first insulative layer 82. A second insulative layer 85 is then formed on etch stop layer 83. A using photoresist 86, a trench or second opening 87 is formed in the second insulative layer 85 at a second location where the wiring is desired and, simultaneously therewith, a second opening 87 is formed through first opening 84 and in first insulative layer 82. The trench 87 and the second opening 87 penetrate through second insulative layer 85 and first insulative layer 82, respectively. Subsequently, a conductive material 88 is simultaneously deposited in the second opening and in the trench so that the conductive material completely fills the second opening and the trench, the trench forming the conductive wiring and the second opening forming the conductive via, with the conductive via providing electrical connection between the conductive wiring and the substrate.

As in the other embodiments of the present invention, the insulative layers can be an oxide material, such as a silicon oxide. The etch stop layer can be any suitable conventional stop material selected consistent with the insulative layers. For example, if the insulative layers are made of silicon oxide, the etch stop layer can be made of silicon nitride, silicon oxynitride or undoped polysilicon. The first opening 84 in etch stop layer 83 can be produced by a conventional photolithographic technique, as by forming a first patterned mask over etch stop layer 83 with a first mask opening in registry with the first location, etching the exposed portions of etch stop layer 83 through the mask opening to form first opening 84 and removing the first mask layer. Preferably, a second patterned mask layer is formed over second insulative layer 85 in registry with the second location prior to simultaneously forming trench 87 in second insulative layer 85 and the second opening through the first opening and in first insulative layer 82. The second mask layer is removed, as by a conventional selective wet etching technique. Subsequently, the conductive material is simultaneously deposited in the second opening and in the trench. The simultaneous formation of the trench in the second insulative layer 85 and the via in first insulative layer 82 can be achieved by a conventional anisotropic etching technique, such as plasma etching and reactive ion etching.

As in the other embodiments of the present invention, after simultaneous deposition of the conductive material in the via and in the trench, the second insulative layer containing the conductive wiring is planarized as by chemical-mechanical polishing. The conductive material can be a metal, preferably a metal selected from the group consisting of aluminum, aluminum-based alloys, and tungsten.

A second aspect of the fourth embodiment comprises etching etch stop layer 83 so that first opening 84 is not formed completely through etch stop layer 83. Upon anisotropic etching, a via having substantially vertical walls is formed.

The fourth embodiment is characterized by the advantageous use of a single etching step to create both the via and trench with a single etch recipe, and obviating the necessity of stripping off etch stop material. An interconnection pattern can be produced employing the fourth embodiment wherein the interwiring spacing is reduced to below about 0.35 µ, preferably to about 0.25 µ.

Figure 9:
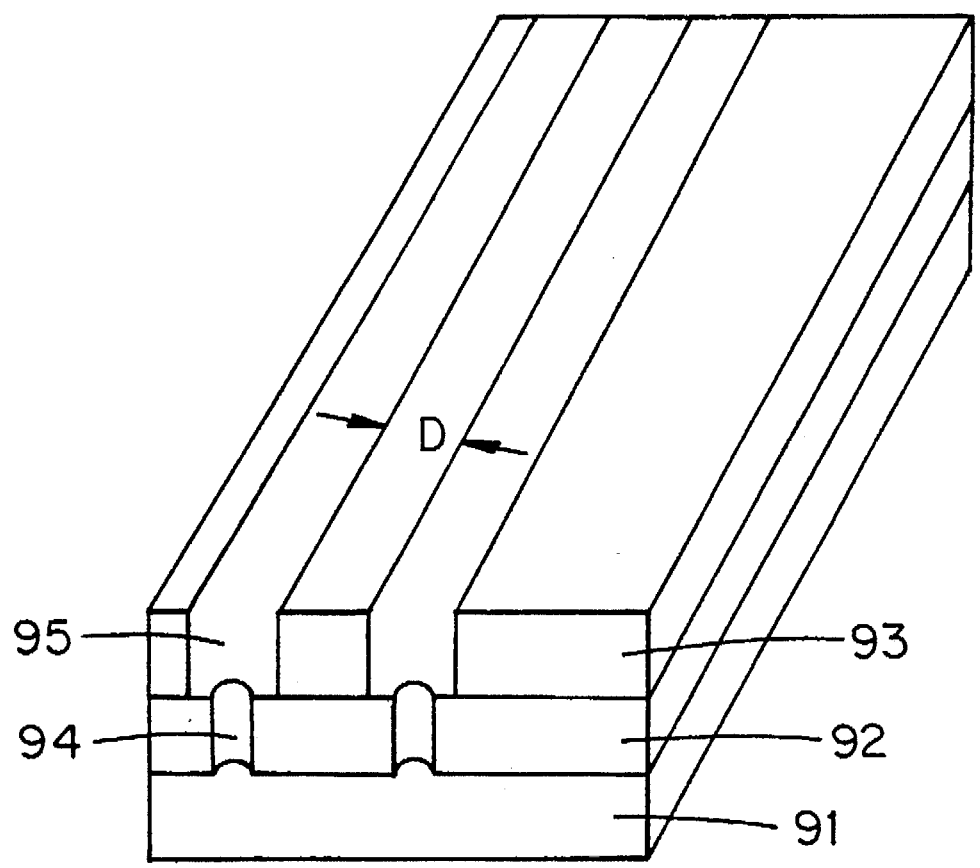
FIG. 9 is a cross-sectional view of a semiconductor device produced in accordance with the present invention.

The improved dual damascene technique of the present invention enables the formation of interconnection structures wherein the interwiring spacings, i.e., the distance between conductive lines is minimized. With reference to FIG. 9, an interconnection wiring pattern is shown comprising first insulative layer 92 on semiconductor substrate 91 and second insulative layer 93 on first insulative layer 92, with conductive vias 94 and conductive wiring or conductive lines 95. The interwiring spacing D between conductive lines 95 can be advantageously reduced in the present invention as required by high density design rule. Preferably, the interwiring spacing is less than about 0.35 µ. It is particularly preferred to provide an interwiring spacing of from about 0.05 µ to about 0.18 µ, most preferably from about 0.05 µ to about 0.10 µ. Thus, the present invention enables the production of semiconductive devices having improved density and ultralarge scale integration comprising a plurality of planarized layers having reduced interwiring spacing.

We claim:

1. A method of forming a conductive wiring and a via on a substrate comprising:

(a) forming a first insulative layer on said substrate;

(b) forming an etch stop layer on said first insulative layer;

(c) forming a second insulative layer on said etch stop layer;

(d) forming an opening in said second insulative layer at a first location where said via is desired, said opening penetrating through said second insulative layer substantially up to but not into said etch stop layer;

(e) forming a trench in said second insulative layer at a second location where said wiring is desired while simultaneously extending said opening through said etch stop layer and through said first insulative layer wherein said trench is wider than and entirely inclusive of said opening; and (f) simultaneously depositing a conductive material in said opening and in said trench so that said conductive material completely fills said opening and said trench, said trench forming said conductive wiring, said opening in said etch stop layer and said first insulative layer forming a conductive via, said conductive via providing electrical connection between said conductive wiring and said substrate.

2. The method recited in claim 1, wherein the first insulative layer and second insulative layer are oxide layers.

3. The method recited in claim 1, wherein said etch stop layer comprises a material selected from the group consisting if silicon nitride, silicon oxynitride and polysilicon, and said first and second insulative layers are silicon oxide.

4. The method as recited in claim 1, further comprising the step of forming a first patterned mask having a first mask opening over said second insulative layer in registry with the first location prior to forming the opening in the second insulative layer.

5. The method as recited in claim 4, further comprising the step of removing said first mask and providing a second mask having a second opening over said second insulative layer in registry with the second location prior to forming said trench in said second insulative layer and simultaneously forming said via through said etch stop layer and said first insulative layer.

6. The method as recited in claim 1, wherein the step of forming said opening in said second insulative layer is achieved by a first etching process.

7. The method as recited in claim 6, wherein the step of forming a trench in the second insulative layer while simultaneously forming a via in said etch stop layer and in said first insulative layer is achieved by a second etching process.

8. The method as recited in claim 7, wherein the first etching process and the second etching process are plasma etching processes.

9. The method as recited in claim 7, wherein the first etching process and the second etching process are reactive ion etching processes.

10. The method as recited in claim 9, wherein said first etching process has a higher selectivity with respect to the etch stop layer than said second etching process.

11. The method as recited in claim 10, further comprising the step of polishing the second insulative layer to planarize said conductive wiring and said second insulative layer.

12. The method as recited in claim 11, wherein the step of polishing is achieved by chemical-mechanical polishing.

13. The method as recited in claim 11, wherein the said conductive material comprises a metal with or without an adhesion/barrier layer, said metal selected from the group consisting of aluminum, tungsten, copper and alloys thereof.

* * * * *